United States Patent [19]

Pennington

[11] 4,424,626

[45] Jan. 10, 1984

[54] ANCHORING DEVICE AND METHOD FOR SECURING A CAPACITOR TO A PRINTED CIRCUIT BOARD

[75] Inventor: Charles E. Pennington, Indianapolis, Ind.

[73] Assignee: Emhart Industries, Inc., Indianapolis, Ind.

[21] Appl. No.: 187,752

[22] Filed: Sep. 16, 1980

[51] Int. Cl.³ .................. H05K 3/34; F16M 13/00
[52] U.S. Cl. .................................. 29/839; 248/351; 361/419
[58] Field of Search .............. 29/837, 838, 839, 840, 29/20 CN, 20 R; 361/400, 417, 419, 420, 427; 336/67; 248/27.1, 351

[56] References Cited

U.S. PATENT DOCUMENTS

| 2,180,919 | 11/1939 | Pool | 361/417 X |
| 2,417,261 | 3/1947 | Morehouse . | |
| 2,423,627 | 7/1947 | Tinnerman . | |
| 3,082,498 | 3/1963 | Oetiker | 24/20 CW |
| 3,237,905 | 3/1966 | Baker et al. . | |

FOREIGN PATENT DOCUMENTS

| 239222 | 7/1962 | Australia | 361/400 |
| 249155 | 10/1962 | Australia | 29/837 |
| 1776919 | 8/1958 | Fed. Rep. of Germany . | |
| 1835059 | 10/1960 | Fed. Rep. of Germany . | |
| 1848945 | 9/1961 | Fed. Rep. of Germany . | |
| 694142 | 7/1953 | United Kingdom | 248/27.1 |
| 932116 | 7/1963 | United Kingdom . | |
| 1022200 | 3/1966 | United Kingdom | 361/400 |

Primary Examiner—Howard N. Goldberg
Assistant Examiner—Carl J. Arbes
Attorney, Agent, or Firm—Robert F. Meyer

[57] ABSTRACT

An anchoring device for securing a capacitor body to a printed circuit board provides a circumferential band for encircling the capacitor body, the band including a crimpable section for reducing the circumference of the band and for applying compression to the band to engage the capacitor body, and a plurality of connectors affixed to the band and extending perpendicular to the circumference thereof for penetrating the printed circuit board to allow mounting of the clamp and thereby the capacitor body to the printed circuit board.

7 Claims, 3 Drawing Figures

1

ANCHORING DEVICE AND METHOD FOR SECURING A CAPACITOR TO A PRINTED CIRCUIT BOARD

BACKGROUND OF THE INVENTION

1. Field of the Invention

The present invention generally relates to devices used for mounting electrical components and, in particular, to such devices as are used for securing capacitors to printed circuit boards.

2. Statement of the Prior Art

Various means have previously been available for securing different forms of capacitors to circuit boards or chassis in which they are used. The simplest of these means include simply soldering the capacitor leads to a printed circuit board in the case of small capacitors. In the case of large capacitors, it is usually necessary to otherwise secure the capacitor body to prevent unnecessary or potentially damaging stress from being applied to the electrical leads. It is particularly necessary when the capacitor mounting is required to meet certain vibration endurance specifications. In conflict with this requirement however are space limitations, the cost and the assembling complexity of the mounting device. The most common previously known devices usually include a band of some sort which is secured around the capacitor and to the chassis or circuit board by either multiple or singular screw means.

SUMMARY OF THE INVENTION

Accordingly, the present invention includes an anchoring device for securing a capacitor body to a printed circuit board comprising, circumferential band means for encircling the capacitor body, the band means including a crimpable section for reducing the circumference of the band and for applying compression to the band to engage the capacitor body and a plurality of connection means affixed to the band means and extending perpendicular to the circumference thereof for penetraing the printed circuit board to allow mounting of the clamp means and thereby the capacitor body to the printed circuit board. The method of the present invention for securing a capacitor body to a printed circuit board comprises the steps of locating a circumferential band means around the capacitor body, the band means having crimpable section for reducing the circumference of the band means and a plurality of connection means affixed to the band means and extending perpendicular to the circumference of the band means, compressing the crimpable section to engage the capacitor body, and securing the band means and the capacitor body to the printed circuit board including penetrating the printed board with the connection means.

BRIEF DESCRIPTION OF THE DRAWINGS

One embodiment of the present invention is described below in respect to the accompanying drawings in which.

DETAILED DESCRIPTION OF THE DRAWINGS

Figure 1:
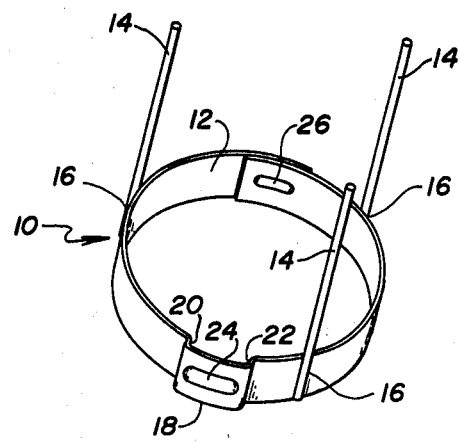
FIG. 1 is a perspective view of an anchoring device constructed according to one embodiment of the present invention.

FIG. 1 shows one form of anchoring device 10 covered by the present invention. The device 10 generally includes a circumferential band means 12 and a plurality of connection means 14. The connection means 14 are each affixed to the circumferential band means 12 at locations 16 by a suitable means. In the present embodiment they are welded. The connection means 14 extend perpendicularly from the circumference of the band means 12. The band means 12 is circular in shape to match it to the particular capacitor to which it will be applied, although any necessary shape may be used. The band means 12 includes a section 18 which is crimpable for reducing the circumference of the band means 12. The section 18 includes a pair of portions 20 and 22 facing in opposite directions which may be simultaneously engaged by a crimping tool to reduce the diameter of the band means 12. Under crimping the portion 24 of section 18 located between the portions 20 and 22 also deforms. The band means 12 is constructed from a single strip of suitable material, in this case metal. The section 18 may be formed by any suitable material and in this case stamping is used. After such stamping the strip is formed into a generally circular shape and the opposite ends are connected at 26 by any suitable means. In this case a tongue on one end of the strip is engaged with an opening located at the other end of the strip.

Figure 2:
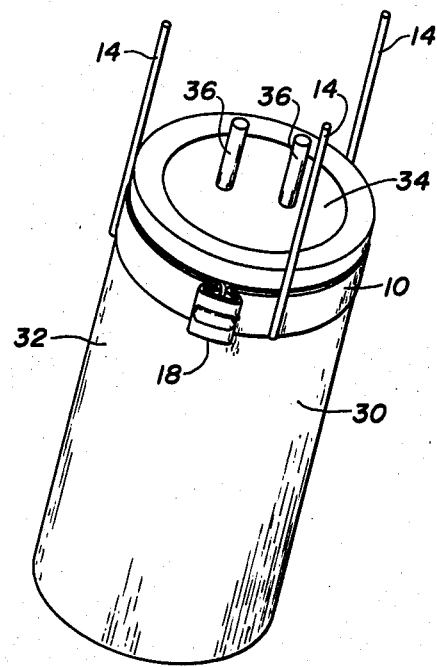
FIG. 2 is a perspective view of the anchoring device of FIG. 1 secured to a capacitor.

FIG. 2 shows the anchoring device 10 affixed to a capacitor 30. The capacitor 30 includes a body 32 having an end 34 from which a pair of electrical leads 36 extend. The anchoring device 10 is affixed to the capacitor body 32 near the end 34 with the connection means 14 extending in the same direction as the electrical leads 36. To apply the device 10 to the capacitor body 32 the device 10 is first located around the capacitor body and then the crimpable section 18 is compressed to cause the band means to engage the capacitor body 32. FIG. 2 shows the shape that the crimpable section 18 takes after crimping. Again, the anchoring device is located to direct the connection means 14 to extend from the capacitor body in the same direction as the electrical leads 36 thereof.

Figure 3:
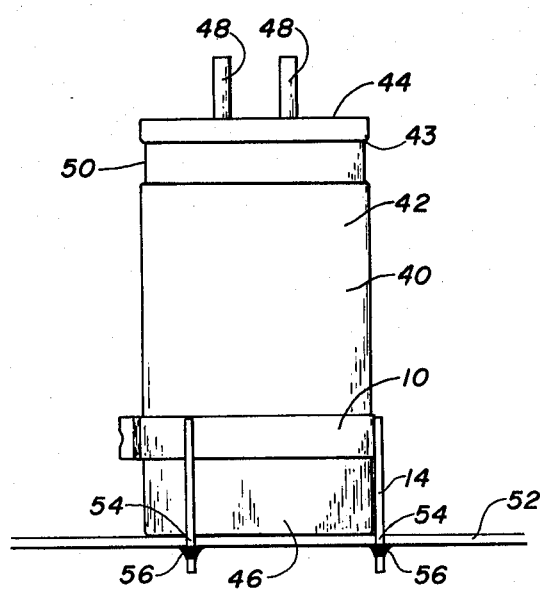
FIG. 3 is a side view of the anchoring device of FIG. 1 secured to capacitor and in use for securing that capacitor to a printed circuit board.

FIG. 3 shows an anchoring device 10 affixed to a capacitor 40. The capacitor 40 includes first end 44 as well as the second end 46 at a different location. Whereas the anchoring device 10 is secured near the first end 44 in FIG. 2, the anchoring device 10 in FIG. 3 is secured near the opposite end 46, away from the electrical leads 48. In other words, the band means 12 is located to direct the connection means 14 to extend from the capacitor body 42 in the opposite direction from the electrical leads 48 thereof.

The capacitor 40 is also clearly shown to have a circumferential groove 50 located near the end 44 thereof. Although this feature is not clear in FIG. 2, it is present there as well and is located beneath the device 10 in FIG. 2. In other words, the device 10 may be secured to the capacitor body 32 to engage the groove 50 as is done in FIG. 2. In such case the band means is constructed having a width suitable for engaging the circumferential groove 50. In this manner the band means 12 would engage the portion 43 of groove 50 if attached to the capacitor body 32 as shown in FIG. 2. This portion 43 would be a surface generally facing away from the attached printed circuit board and thus would form a more secure attachment.

Also shown in FIG. 3 is the connection of the anchoring device 10 and thus the capacitor 40 to a printed circuit board 52. For this purpose, the connection means 14 are caused to penetrate the printed circuit board 52 at locations 56. This is normally accomplished by first drilling holes at the locations 56. The connection means 14 are secured to the circuit board 52 by soldering the leads to the side of the board opposite the capacitor 40. This soldering, located at 56, may be accomplished by any suitable method such as by dip soldering. Thusly, all of the components connected to circuit board 52 may be soldered in one easy step.

Anchoring devices constructed according to the present invention are advantageous as they provide a versatile and very secure means for attaching a capacitor to a printed circuit board while simultaneously minimizing cost, size and the complexity of assembling the device. The device of the present invention is versatile as it may easily be constructed to fit any size or shape of capacitor and may be readily attached to any portion of such capacitor. The secureness of the attachment may be insured by varying the point of connection of the device to the capacitor. The economy is insured by the simple manufacturing processes needed to produce the device. Problems from space limitations and assembling complexity are avoided by the elimination of screw means either above or below the circuit board.

The present invention is described in respect to the embodiment shown in the accompanying drawings which are intended to be taken in an illustrative and not a limiting sense. Various modifications and changes may be made to the presently described embodiment while remaining within the scope of the present invention as defined in the appended claims.

What is claimed is:

1. An anchoring device for securing a capacitor body to a printed circuit board, comprising:
   circumferential band means for encircling said capacitor body, said band means including a crimpable section for reducing the circumference of said band and for applying compression to said band to engage said capacitor body, said band means also including means for engaging recesses in said capacitor body to further secure said capacitor body by contacting surfaces thereof intended to face away from said printed circuit board; and
   a plurality of connection means affixed to said band means and extending perpendicular to the circumference therefor for penetrating said printed circuit board to allow mounting of said clamp means and thereby said capacitor body to said printed circuit board.

2. The device of claim 1, wherein said means for engaging includes said band means having a width dimension suitable for insertion into a circumferential groove in said capacitor body.

3. A method for securing a capacitor body to a printed circuit board, comprising the steps of:
   locating a circumferential band means around said capacitor body including positioning said band means over a circumferential groove in said capacitor body, said band means having a crimpable section for reducing the circumference of said band means and a plurality of connection means affixed to said band means and extending perpendicular to the circumference of said band means;
   compressing said crimpable section to engage said band means with said circumferential groove and said capacitor body; and
   securing said band means and said capacitor body to said printed circuit board including penetrating said printed circuit board with said connection means.

4. The method of claim 3, wherein said securing includes soldering said connection means to the side of said printed circuit board opposite said capacitor body.

5. The method of claim 3, wherein said locating includes directing said connection means to extend from said capacitor body in the same direction as electrical leads thereof.

6. The method of claim 3, wherein said locating includes directing said connection means to extend from said capacitor body in the opposite direction from electrical leads thereof.

7. The method of claim 3, wherein said compressing includes crimping said crimpable section.

* * * * *